United States Patent
Seneviratne et al.

(10) Patent No.: US 11,489,464 B2
(45) Date of Patent: Nov. 1, 2022

(54) ENERGY HARVESTING FOR SENSOR SYSTEMS

(71) Applicant: NATIONAL ICT AUSTRALIA LIMITED, Eveleigh (AU)

(72) Inventors: Aruna Seneviratne, Eveleigh (AU); Sara Khalifa, Eveleigh (AU); Mahbub Hassan, Eveleigh (AU)

(73) Assignee: NATIONAL ICT AUSTRALIA LIMITED, New South Wales (AU)

( * ) Notice: Subject to any disclaimer, the term of this patent is extended or adjusted under 35 U.S.C. 154(b) by 951 days.

(21) Appl. No.: 16/084,922

(22) PCT Filed: Mar. 14, 2017

(86) PCT No.: PCT/AU2017/050227
§ 371 (c)(1),
(2) Date: Sep. 13, 2018

(87) PCT Pub. No.: WO2017/156579
PCT Pub. Date: Sep. 21, 2017

(65) Prior Publication Data
US 2019/0081578 A1 Mar. 14, 2019

(30) Foreign Application Priority Data
Mar. 14, 2016 (AU) ............... 2016900941

(51) Int. Cl.
*H02N 2/18* (2006.01)
*H01L 41/113* (2006.01)
*G01P 15/09* (2006.01)
*G01C 22/00* (2006.01)
*G05B 19/042* (2006.01)

(52) U.S. Cl.
CPC ........... *H02N 2/181* (2013.01); *G01C 22/006* (2013.01); *G01P 15/09* (2013.01); *H01L 41/1136* (2013.01); *G05B 19/0423* (2013.01); *H01L 41/1132* (2013.01)

(58) Field of Classification Search
CPC ............... H01L 41/113; H01L 41/1132; H01L 41/1134; H01L 41/1136; H01L 41/1138
USPC ......................................... 310/339
See application file for complete search history.

(56) References Cited

U.S. PATENT DOCUMENTS

| | | | | |
|---|---|---|---|---|
| 5,801,475 | A | * | 9/1998 | Kimura ................... G01P 13/00 310/319 |
| 2013/0082570 | A1 | * | 4/2013 | Ide ........................ H02N 2/181 310/319 |

OTHER PUBLICATIONS

International Search Report (ISR) and Written Opinion (WO) dated Jun. 8, 2017 for Application No. PCT/AU2017/050227.

(Continued)

*Primary Examiner* — Derek J Rosenau
(74) *Attorney, Agent, or Firm* — Ladas & Parry LLP

(57) ABSTRACT

Described herein is an energy harvesting system comprising a transducer and a processor. The transducer generates an electric signal from ambient energy. The processor is configured to process the electric signal to perform pattern recognition of the electric signal so as to determine and output a characteristic of a source of the ambient energy. The pattern recognition comprises statistical analysis and frequency domain analysis.

20 Claims, 3 Drawing Sheets

(56) References Cited

OTHER PUBLICATIONS

S. Khalifa et al. "Pervasive Self-Powered Human Activity Recognition without the Accelerometer", Proc. Int'l Conf. Pervasive Computing and Comm., 2015, pp. 79-86.

Khalifa, S. et al., "Energy-Harvesting Wearables for Activity-Aware Services", IEEE Internet Computing, IEEE, Aug. 31, 2015, vol. 19, Iss. 5, pp. 8-16.

* cited by examiner

ENERGY HARVESTING FOR SENSOR SYSTEMS

TECHNICAL FIELD

This disclosure relates to providing power to a sensor system. In one form the power is provided with the use of kinetic energy harvesting. In one form the sensor system is in wearable technology, and is used for human activity recognition.

BACKGROUND

One of the challenges in sensor systems is meeting the power requirements where the systems are wireless or rely on batteries. One possible solution for sensor systems deployed within a suitable context that lends itself to energy harvesting, is to harvest energy from the system environment and to use this harvested energy to contribute to the power used for the sensor system. Energy can be harvested from a number of different sources, such as solar power, thermal energy (or temperature gradients), wind energy, electromagnetic energy, salinity gradients and kinetic energy from movement or vibration.

One example of this is in wearable technology, such as activity-aware services that make use of human activity recognition (HAR) in various domains like healthcare and indoor positioning. Battery life is a problem with wearable HAR technology so that wearables therefore either need large batteries or the batteries must be charged regularly in order to achieve sustained operation.

Using energy harvesting has been considered for providing power for wearable HAR technology, however the amount of energy that can be harvested is generally small in comparison to the power requirements of the HAR application.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

SUMMARY

Conventional sensor systems typically have (1) a sensing component that provides sensed data, (2) a processor for extracting data from the sensed data, and (3) a component for distributing the sensed and/or processed data (e.g. memory or a transmitter). A power source that provides power for all three of these components of the system is required. If the power source relies (either wholly or in part) on harvested energy for the power supply then it would be beneficial to reduce the power requirements of one or more of the three components. One way of doing this is to remove the sensing component by incorporating the sensing functionality into a transducer used for energy harvesting.

Described herein is an energy harvesting system that comprises:
a transducer that generates an electric signal from ambient energy; and
a processor configured to process the electric signal to perform pattern recognition of the electric signal so as to determine and output an identifier or characteristic of a source of the ambient energy, wherein the pattern recognition comprises statistical analysis and frequency domain analysis. The characteristic may be determined as being one of several characteristics.

The ambient energy may be kinetic energy generated by an activity. The identifier may be output to a transmitter, to a memory, or to a processor. The system may comprise a transmitter for transmitting the identifier of the activity. The system may include a memory for storing the identifier.

The system may comprise an energy store that stores the electrical signal. The energy store may provide power to the system. The energy store may provide power to the transmitter, the memory and/or the processor.

The transducer may be a kinetic energy harvester such as a piezoelectric transducer. The piezoelectric transducer may have a cantilevered beam configuration. The kinetic energy harvester may be adapted for a frequency range associated with the activity, for example a 1-10 Hz range for human movement such as walking, running and climbing stairs.

The kinetic energy harvester may comprise two or three orthogonal transducers providing multi-axial electric signals that comprise identifying features associated with directions of the activity.

The processor may determine the identifier of the activity by extracting features from the electric signal.

The processor may perform the statistical analysis by extracting statistical features from the electric signal. The extracted statistical features may comprise at least one of the following: the root mean square, peak-to-peak value, peak-to-peak difference, mean peak, mean peak distance, maximum peak, maximum peak distance, mean, variance, standard deviation, minimum, maximum, range, absolute mean, coefficient of variation, skewness, kurtosis, quartiles, inter quartile range, mean crossing rage, absolute area, energy, mean absolute deviation, and auto-correlation.

The processor may perform the frequency domain analysis by extracting frequency domain features from the electrical signal, wherein the extracted frequency features comprise at least one of the following: dominant frequency, dominant frequency ratio, frequency domain entropy, and power spectrum mean.

The processor may determine the identifier by using a classification method comprising at least one of the following: Decision Tree (DT), K-Nearest Neighbour (KNN), Multilayer Perceptron (MLP), Support Vector Machine (SVM), and Naïve Bayes (NB).

The identifier (also referred to as a characteristic of the source of ambient energy) may indicate human gait. The identifier may indicate any one or more of the following human activities: walking, running, standing, ascending stairs, descending stairs, vacuuming, ascending on an escalator, descending on an escalator, walking/running up a ramp, walking/running down a ramp, etc. The identifier may indicate a number of steps. The identifier may indicate a calorie expenditure estimation.

The system may be adapted to be worn on or close to a specific part of the body, for example a wrist, waist or a knee.

Also described is a method for energy harvesting comprising:
receiving and transforming ambient energy into an electrical signal;

processing the electrical signal to extract at least one distinguishing feature, wherein the processing comprises using pattern recognition comprising statistical analysis and frequency domain analysis;

classifying a source of the ambient energy based on the at least one distinguishing feature; and outputting the classification.

The source may be classified as being one of several classifications.

The method may also comprise storing the electrical signal for use as a power source. The power source may be used to power one or more of the method steps.

The receiving and transforming may be done with a kinetic energy harvester, and the kinetic energy harvester may be a piezoelectric transducer. The ambient energy may be kinetic energy.

The statistical analysis may comprise extracting at least one of the following distinguishing features: the root mean square, peak-to-peak value, peak-to-peak difference, mean peak, mean peak distance, maximum peak, maximum peak distance, mean, variance, standard deviation, minimum, maximum, range, absolute mean, coefficient of variation, skewness, kurtosis, quartiles, inter quartile range, mean crossing rage, absolute area, energy, mean absolute deviation, and auto-correlation.

The frequency domain analysis may comprise extracting at least one of the following distinguishing features: dominant frequency, dominant frequency ratio, frequency domain entropy, and power spectrum mean.

The classifying may be performed using at least one of the following: Decision Tree (DT), K-Nearest Neighbour (KNN), Multilayer Perceptron (MLP), Support Vector Machine (SVM), and Naïve Bayes (NB).

The outputting may be to a transmitter, a memory or a processor.

As used herein, except where the context requires otherwise, the term "comprise" and variations of the term, such as "comprising", "comprises" and "comprised", are not intended to exclude further additives, components, integers or steps.

DESCRIPTION OF EMBODIMENTS

Conventional systems used for determining characteristics of movement, e.g. to provide activity-aware services such as in wearable HAR systems, typically make use of accelerometers to obtain data about the activities. However, the power requirement of accelerometers is significant, and has been shown to range between 0.35 and 5 times the harvested kinetic energy when detecting common human activities (e.g. walking and running). Some activities generate only a few µW, not enough to power both an accelerometer and radio communication required to transmit the sensed data.

Figure 1:
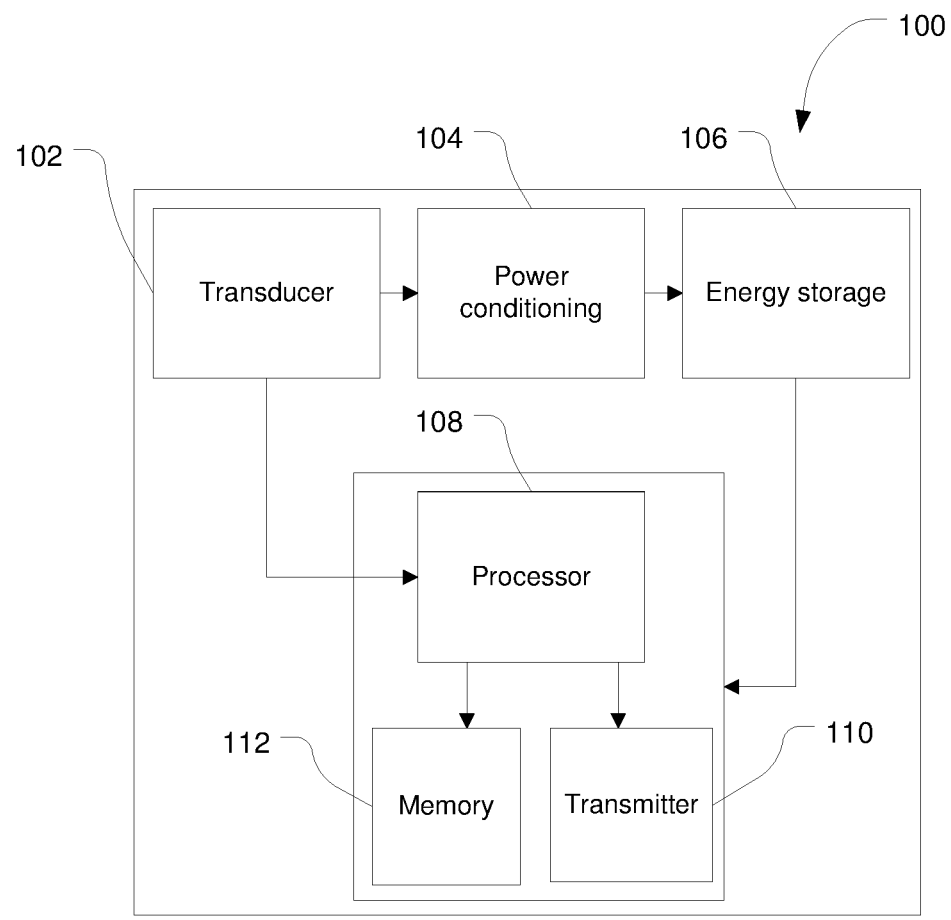
FIG. 1 is a schematic representation of a system for identifying the source of ambient energy.

FIG. 1 is a schematic representation of a system 100 for identifying an activity that uses kinetic energy harvesting and does not use an accelerometer. Instead of using an accelerometer to obtain data about the activity, a transducer 102 harvests ambient energy and the power generated from the harvested energy provides information about the activity.

In this embodiment the transducer 102 is a piezoelectric transducer with a cantilevered beam configuration. When the piezoelectric material is subjected to a mechanical stress due to any source of environmental vibrations, it expands on one side and contracts on the other. Positive charges accumulate on the expanded side and negative charges on the contracted side, generating an AC voltage as the beam oscillates around the neutral position. The amount of voltage is proportional to the applied stress, which means that different vibration patterns would generate different AC voltage patterns. An example of a piezoelectric KEH transducer is the MIDE Volture transducer.

The AC output of the transducer is rectified and regulated by a power conditioning circuit 104 so that it can be stored in the energy storage 106 (a battery or capacitor) as DC voltage used to power the processor 108 and transmitter 110. Power regulation may include analogue to digital conversion. The stored energy may be used to fully or partially power the processor 108, memory 112, and/or transmitter 110.

The regulated power may not be suitable for detecting features in the electric signal produced by the transducer because regulation removes potential patterns from the signal. In the system shown in FIG. 1, the AC voltage produced by the transducer is used by the processor 108 to determine the source of the ambient energy. In this example, determining the source of the ambient energy means recognising the activity performed by a user resulting in the kinetic energy that is harvested.

The activity performed is identified as one amongst several possible activities, i.e. walking, standing, running, ascending or descending stairs, vacuuming, going up/down an escalator, walking/running up a ramp, walking/running down a ramp, etc. An activity identifier describes the identified activity performed, and may be stored in memory 112 and/or transmitted to another system or processor via the transmitter 110.

Figure 2:
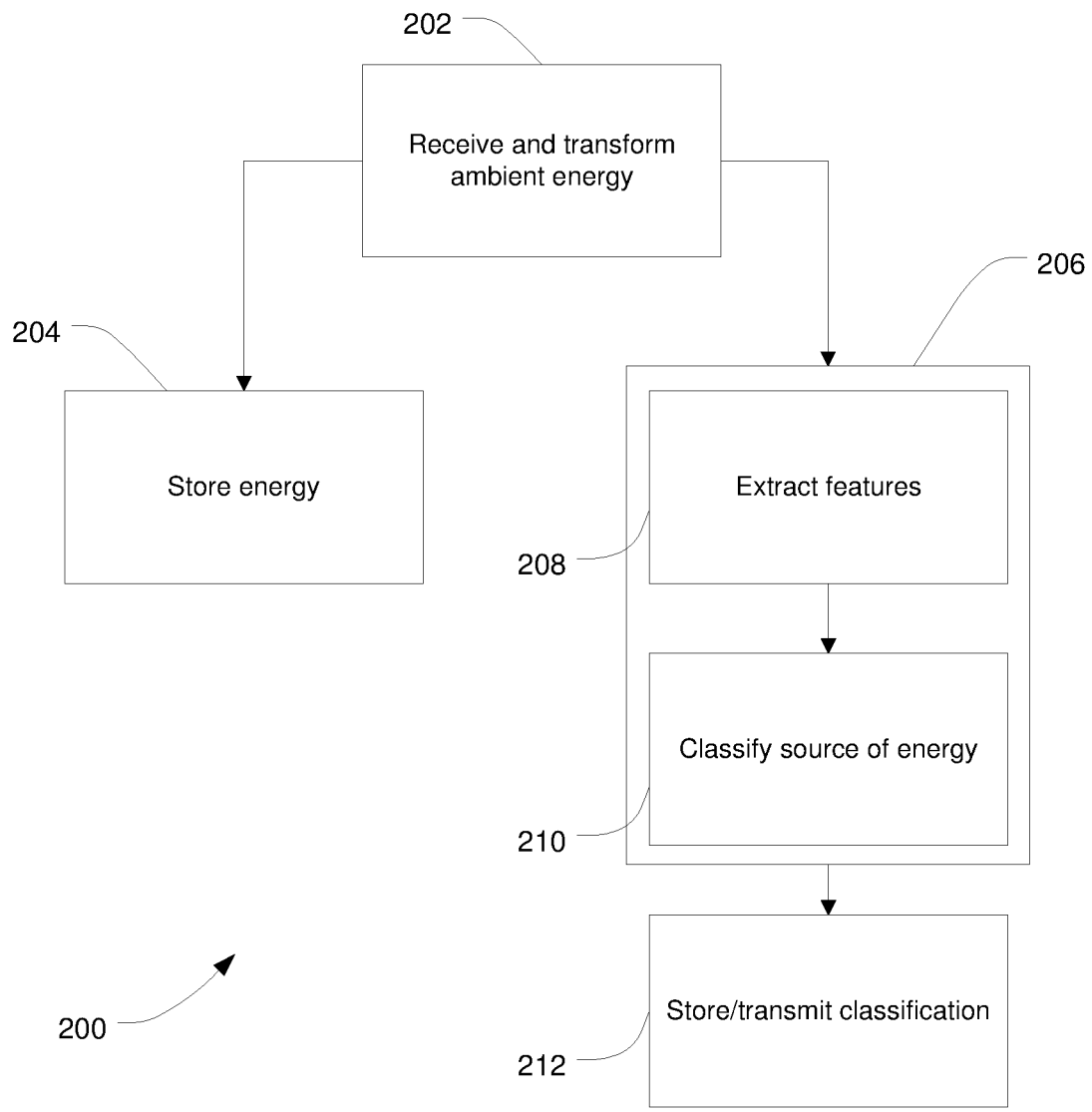
FIG. 2 is a flow diagram of a method for identifying the source of ambient energy.

The process 200 used to determine the activity identifier may be understood with reference to FIG. 2.

The transducer 102 receives and transforms ambient energy 202, in this example kinetic energy. The resulting power is stored 204 over a period of time in the energy storage 104 (e.g. a capacitor or battery), and this step may include rectifying and regulating the electric signal output by the transducer.

The unprocessed electric signal output from the transducer is then processed 206 by the processor 108. This includes first extracting features 208 from the electric signal. These may be any combination of distinguishing features that describe the data, for example the root mean square, peak-to-peak value, peak-to-peak difference, mean peak, mean peak distance, maximum peak, maximum peak distance, mean, variance, standard deviation, minimum, maximum, range, absolute mean, coefficient of variation, skewness, kurtosis, quartiles, inter quartile range, mean crossing rage, absolute area, dominant frequency, dominant frequency ratio, energy, frequency domain entropy, mean absolute deviation, auto-correlation, power spectrum mean.

Some of these are described in Table 1 below. As can be seen, the features used for pattern recognition in the harvested signal combine both statistical analysis as well as frequency domain analysis.

TABLE 1

An example feature set used to analyse the source of harvested ambient energy

| | | Feature | Abbreviation | Description |
|---|---|---|---|---|
| Single axis features | Time-domain features | mean | mean | the central value of a window of samples. |
| | | variance | var | a measure the amount of variation or dispersion from the mean. |
| | | standard deviation | std | the square root of the variance. |
| | | minimum | min | the minimum value in a window of samples |
| | | maximum | max | the maximum value in a window of samples |
| | | range | range | the difference between the maximum and the minimum values in a window of samples |
| | | Absolute Mean | absMean | average of absolute values, |
| | | Coefficient of Variation | CV | ratio of standard deviation and mean times 100; measure of signal dispersion, |
| | | Skewness | skew | measure of asymmetry of the probability distribution of the window of samples, |
| | | Kurtosis | kurt | measure of peakedness of the probability distribution of the window of samples, |
| | | Quartiles: 1st Quartile: 2nd Quartile 3rd Quartile | Q1 Q2 Q3 | measures the overall distribution of the signal samples over the window, |
| | | Inter Quartile Range | IQR | the difference between the upper (third) quartile and the lower (first) quartile of the window of samples; also measures the dispersion of the signal samples over the window, |
| | | Mean Crossing Rate | MCR | measures the number of times the signal crosses the mean value; captures how often the signal varies during the time window, |
| | | Absolute Area | absArea | the area under the absolute values of the signal samples. It is the sum of absolute values of the signal samples over the window, |
| | Frequency-domain features | Dominant Frequency Ratio | DFreqR | it is calculated as the ratio of highest magnitude FFT coefficient to sum of magnitude of all FFT coefficients. |
| | | Energy | FDEnergy | it is a measure of total energy in all frequencies. It is calculated as the sum of the squared discrete FFT component magnitudes. |

$$\text{Energy} = \sum_{i=1}^{L/2} F_i^2 \qquad (4.3)$$

where $F_i$ is the magnitude of FFT coefficients.

| | | Entropy | FDEntropy | captures the impurity in the measured data. It is calculated as the information entropy of the normalized values of FFT coefficient magnitude. |

$$\text{Entropy} = -\sum_{i=1}^{L} Fn_i \log_2(Fn_i) \qquad (4.4)$$

where $Fn_i$ is the normalized value of FFT coefficient magnitude.

More particularly, it has been found that features that are particularly useful when harvesting kinetic energy with a piezoelectric KEH are the ones shown in the feature set in Table 2 below.

TABLE 2

A "Vibration Feature Set" (VFS) used to extract features from KEH data

| Feature | Abbreviation | Description |
|---|---|---|
| root mean square | RMS | it is the square root of the arithmetic mean of the squares of the values. The RMS is a measurement of the effective energy content in a the signal. |
| peak-to-peak | PktPk | it is the difference between the maximum peak value and the minimum peak value. It indicates the maximum excursion of the signal. |
| peak-to-peak difference | PktPkDiff | The difference between the maximum difference between peak values and the minimum difference between peak values of the sinusoidal wave. It indicates the maximum excursion of the time periods. |
| mean Peak | meanPk | The mean value of the differences between all the peak values. It quantifies the average variation level of the values of the signal. |
| mean Peak Distance | meanDisPk | The mean value of the differences between the all the distances (time periods) between peak values. It quantifies the average variation level of the time periods of the signal. |

TABLE 2-continued

A "Vibration Feature Set" (VFS) used to extract features from KEH data

| Feature | Abbreviation | Description |
|---|---|---|
| maximum Peak | maxPk | The maximum value of the differences between all the peak values. It quantifies the maximum variation level of the time periods of the signal. |
| maximum Peak Distance | maxDisPk | The maximum value of the differences between all the distances (time periods) between peak values. It quantifies the maximum variation level of the time periods of the signal. |

The kinetic energy harvester may comprise two or three orthogonal transducers providing multi-axial electric signals that comprise identifying features associated with directions of the activity. In such embodiments, the feature set used may include features particular to multi-axial data, as shown in Table 3.

TABLE 3

Multi-axial feature set

| multiaxes features | Time-domain features | Total absolute area | TAA of the three axes the absolute area of all three axis. |
|---|---|---|---|

$$totalAA = \sum_{i=1}^{L} |Acc_x| + |Acc_y| + |Acc_z| \quad (4.5)$$

where $|Acc_x|$, $|Acc_x|$, and $|Acc_x|$ are the absolute values of the three axes x, y, and z respectively. L is the length of the window.

| | | total magnitude area | MMA | the signal magnitude of the three axes averaged over the time window. |
|---|---|---|---|---|

$$totalMA = \frac{\sum_{i=1}^{L} \sqrt{Acc_x^2 + Acc_y^2 + Acc_z^2}}{L} \quad (4.6)$$

| | | Correlation Corr(X,Y) Corr(X,Z) Corr(Y,Z) | CorrXY CorrXZ CorrYZ | it measures the dependence relationship between two axes |
|---|---|---|---|---|

Following the pattern recognition and feature extraction 208, the data is classified 210 according to one of several possible identifiers (at least three or more), e.g. kinetic energy may have been harvested from one of walking, running, standing, ascending or descending stairs, etc. Classification 210 is performed using a suitable known method, such as Decision Tree (DT), K-Nearest Neighbour (KNN), Multilayer Perceptron (MLP), Support Vector Machine (SVM), or Naïve Bayes (NB).

The outcome of the identification process 206 is then output 212 according to the particular application. For example, where a wearable is used for continuous HAR then the output may be stored in memory on the wearable for later retrieval (e.g. in wired communication with a computer), the output may be displayed on the wearable device, or the output may be transmitted with wireless communication to another processor or computer.

It has been found that, with an appropriate feature set (e.g. as shown in Table 2), and an appropriate classifier (e.g. KNN), accuracy of up to 83% can be obtained in HAR. This can be improved even further depending on the placement of the transducer, e.g. handheld, on a wrist, on the waist, hip or at the knee. For example, moving the transducer from a handheld position to a waist position resulted in an average improvement of accuracy from 83% to 87%. By eliminating the accelerometer that is typically used in HAR systems, a power saving of 70-80% in comparison to conventional systems may be achieved.

The processing 206 may include determining other information from the electric signal, as described below with reference to the examples presented.

Example 1—Step Count

Characteristics of harvested energy can be used to detect steps in human motion and provide a step count as an output. One method for doing this uses a peak detection algorithm. Because of the irregularity of human movements and also hardware noise, not all detected peaks are valid steps. Peaks that are unlikely to be associated with steps and that are to be avoided in determining step count can be avoided by the use of two thresholds: $T_1$ is the minimum peak height, and $T_2$ is the minimum distance between every two consecutive peaks. Using these thresholds, the peaks that represent valid steps are only those peaks higher than $T_1$ and separated by at least $T_2$. Using peak detection, step count using this method has been shown to have an accuracy of up to 96%.

Figure 3:
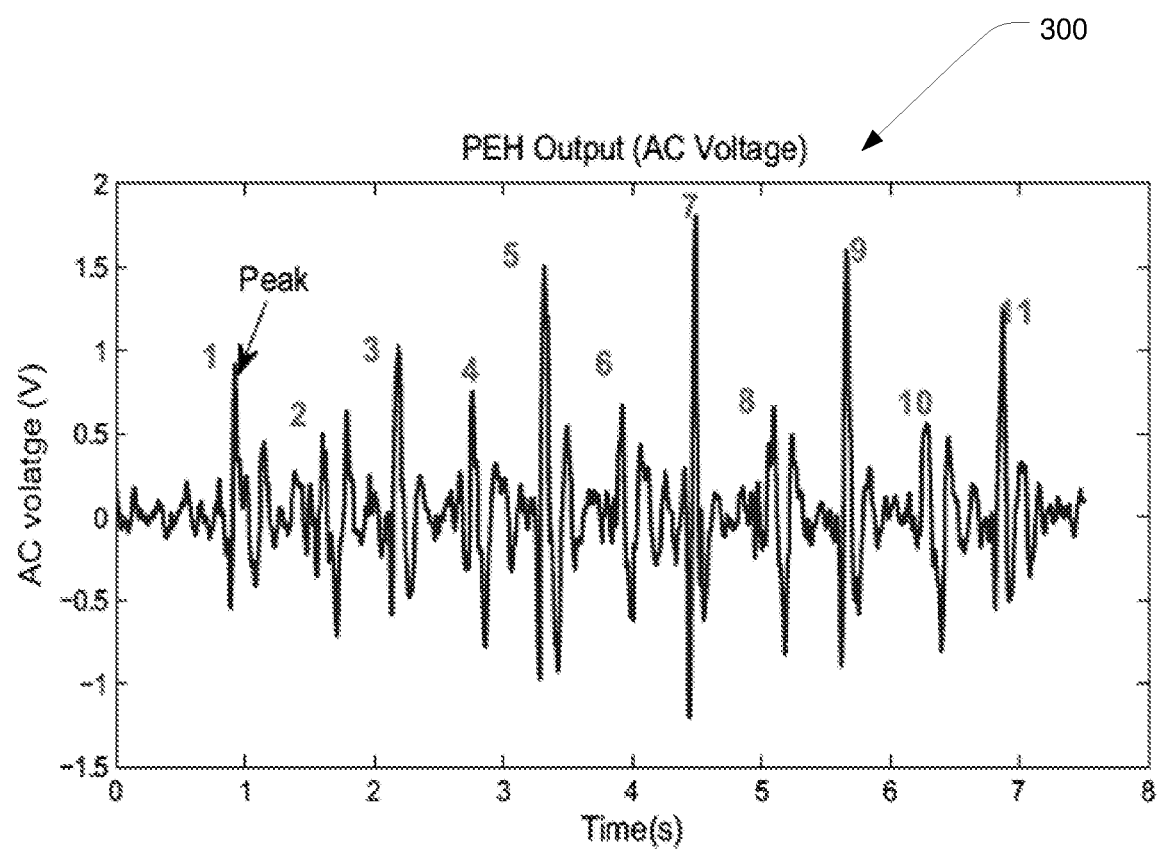
FIG. 3 is the voltage output from a piezoelectric energy harvester (PEH) where the voltage peaks accord with the step count.

The peak height threshold $T_1$ and the step distance threshold $T_2$ may be determined from the data collected using machine learning, or may be selected based on a predetermined value. For example, referring to FIG. 3, $T_1$=0.2V and $T_2$=0.4 ms for the example voltage output 300 that is output from the transducer.

In addition to this peak detection algorithm, step count can also be determined using a zero crossing detection algorithm or a moving variance detection algorithm.

Example 2—Calorie Expenditure

Calorie expenditure may be estimated by incorporating anthropometric features (e.g. height, age, weight) together with the electric signal in a regression model to estimate calorie expenditure. The anthropometric features are input by the user and the linear regression model is trained, e.g. using indirect calorimeters to provide a calorie expenditure estimate (CEE). A suitable regression model may be represented as follows:

$$\overline{CEE}_{volt} = X\beta + \varepsilon$$

where $\overline{CEE}_{volt}$ indicates the estimated calorie expenditure at the kth minute. X denotes the vector of input signals, including the anthropometric features of the subjects, and the output voltage signals from the energy harvester. The $\beta$ and $\varepsilon$ are the vectors of coefficients and residual error, respectively. It has been shown that the average (over one second or longer) CEE achieved using harvested energy compares well with conventional methods using accelerometers.

The description above has focused on human activity recognition with examples relating to characteristics of human activity (i.e. step count and calorie expenditure). In that respect the relevant sensing pertains to human activities, and the type of energy used for energy harvesting for these examples is kinetic energy. Advantageously, a large number of activities can be identified because the pattern recognition performed for the electric signal generated by the transducer may use both statistical analysis as well as frequency domain analysis. This sophisticated combination technique allows several different distinguishing characteristics to be identified within the harvested signals.

The system and methods described herein can be extended to other types of sensed phenomena where energy may be harvested from the relevant environment in a different form. For example, a temperature sensor arrangement may be powered by harvested heat energy. In a comparable way the characteristics of the harvested heat energy may be used to indicate characteristics of the heat source such as the temperature.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. An energy harvesting system comprising:
    a piezoelectric transducer that generates an electric signal from ambient energy; and
    a processor configured to process the electric signal to perform pattern recognition of the electric signal so as to determine and output a characteristic of a source of the ambient energy, wherein the pattern recognition comprises a statistical analysis and a frequency domain analysis of the electric signal,
    wherein the processor performs the statistical analysis includes extracting statistical features from the electric signal, wherein the extracted statistical features comprise any combination of the following: the root mean square, peak-to-peak value, peak-to-peak difference, mean peak, mean peak distance, maximum peak, and maximum peak distance.

2. The system of claim 1, wherein the characteristic is determined as being one of several characteristics.

3. The system of claim 1, wherein the system further comprises an energy store that stores energy from the electrical signal.

4. The system of claim 3, wherein the energy store provides power to the system.

5. The system of claim 1, wherein the transducer is a piezoelectric transducer with a cantilevered beam configuration.

6. The system of claim 5 wherein the kinetic energy harvester is adapted for operation in a frequency range associated with the activity.

7. The system of claim 6 wherein the kinetic energy harvester is adapted for operation in a 1-10 Hz range.

8. The system of claim 5, wherein the kinetic energy harvester comprises two or three orthogonal transducers providing multi-axial electric signals that comprise identifying features associated with directions of the activity.

9. The system of claim 1 wherein the processor performs the statistical analysis by extracting statistical features from the electric signal, wherein the extracted statistical features further comprise at least one of the following:
    mean, variance, standard deviation, minimum, maximum, range, absolute mean, coefficient of variation, skewness, kurtosis, quartiles, inter quartile range, mean crossing rage, absolute area, energy, mean absolute deviation, and auto-correlation.

10. The system of claim 1, wherein the processor performs the frequency domain analysis by extracting frequency domain features from the electrical signal, wherein the extracted frequency features comprise at least one of:
    dominant frequency, dominant frequency ratio, frequency domain entropy, and power spectrum mean.

11. The system of claim 1, wherein the characteristic comprises an indicator of human activity selected from a group consisting of: walking, running, standing, ascending stairs, descending stairs, vacuuming, ascending on an escalator, descending on an escalator, moving up a ramp and moving down a ramp.

12. The system of claim 11, wherein the characteristic comprises an indicator of a number of steps.

13. The system of claim 11, wherein the characteristic comprises a calorie expenditure estimation.

14. The system of claim 12, wherein the processor determines the characteristic by using a classification method comprising at least one of:
    Decision Tree (DT), K-Nearest Neighbour (KNN), Multilayer Perceptron (MLP), Support Vector Machine (SVM), and Naïve Bayes (NB).

15. A method for energy harvesting comprising:
    receiving and transforming ambient energy into an electrical signal;
    processing the electrical signal to extract at least one distinguishing feature, wherein the processing comprises using pattern recognition comprising a statistical analysis and a frequency domain analysis of the electric signal, wherein the statistical analysis includes extracting statistical features from the electric signal, wherein the extracted statistical features comprise any combination of the following: the root mean square, peak-to-peak value, peak-to-peak difference, mean peak, mean peak distance, maximum peak, and maximum peak distance;
    classifying a source of the ambient energy based on the at least one distinguishing feature; and
    outputting the classification.

16. The method of claim 15 further comprising:
    storing the electrical signal for use as a power source;
    using the power source to power one or more of the receiving, transforming, processing, classifying and outputting.

17. The method of claim 15, wherein the statistical analysis further comprises extracting at least one of the following distinguishing features:
   mean, variance, standard deviation, minimum, maximum, range, absolute mean, coefficient of variation, skewness, kurtosis, quartiles, inter quartile range, mean crossing rage, absolute area, energy, mean absolute deviation, and auto-correlation.

18. The method of claim 15, wherein the frequency domain analysis comprises extracting at least one of:
   dominant frequency, dominant frequency ratio, frequency domain entropy, and power spectrum mean.

19. The method of claim 15, wherein the classifying is performed using at least one of:
   Decision Tree (DT), K-Nearest Neighbour (KNN), Multilayer Perceptron (MLP), Support Vector Machine (SVM), and Naïve Bayes (NB).

20. The method of claim 15, wherein the source is classified as being one of several classifications.

* * * * *